(12) United States Patent
Edman et al.

(10) Patent No.: US 6,477,071 B1
(45) Date of Patent: Nov. 5, 2002

(54) METHOD AND APPARATUS FOR CONTENT ADDRESSABLE MEMORY WITH A PARTITIONED MATCH LINE

(75) Inventors: Anders Edman, Rönninge (SE); Henrik Johansson, Skärholmen (SE)

(73) Assignee: Switchcore AB, Lund (SE)

( * ) Notice: Subject to any disclaimer, the term of this patent is extended or adjusted under 35 U.S.C. 154(b) by 0 days.

(21) Appl. No.: 09/850,882

(22) Filed: May 7, 2001

(51) Int. Cl.[7] .............................................. G11C 15/00
(52) U.S. Cl. ..................................... 365/49; 365/189.07
(58) Field of Search ............................. 365/49, 189.07, 365/194, 233

(56) References Cited

U.S. PATENT DOCUMENTS

| | | | |
|---|---|---|---|
| 5,396,449 A | 3/1995 | Atalla et al. .................... 365/49 |
| 5,463,751 A | * 10/1995 | Yonezawa et al. ............. 365/49 |
| 5,517,441 A | 5/1996 | Dietz et al. ..................... 365/49 |
| 5,592,407 A | 1/1997 | Konishi et al. ................. 365/49 |
| 5,828,593 A | 10/1998 | Schultz et al. ................. 365/49 |
| 5,978,246 A | * 11/1999 | Shindo ........................... 365/49 |
| 5,999,435 A | * 12/1999 | Henderson et al. ............ 365/49 |
| 6,212,106 B1 | * 4/2001 | Kurotsu ......................... 365/49 |
| 6,295,576 B1 | * 9/2001 | Ogura et al. ................... 365/49 |
| 6,310,880 B1 | * 10/2001 | Waller ........................... 365/49 |

* cited by examiner

*Primary Examiner*—Trong Phan
(74) *Attorney, Agent, or Firm*—Coudert Brothers LLP

(57) ABSTRACT

The present invention provides a content addressable memory (CAM) circuit that includes at least one row of memory cells storing data to be subjected to search data for a compare operation, with the cells in each row being inter-connected by a match line. Each cell can, if the search data does not match the stored data, discharge the match line in an evaluation operation. According to the present invention, a match line is partitioned into a least two segments, each segment having a first unit for precharging and evaluating the match line segment and a second unit for determining the result of the evaluation operation. The compare operation of the second and any subsequent segments is performed and the corresponding matchline segment involved only if the result of the compare operation of the respective preceding segment indicates a data match.

13 Claims, 3 Drawing Sheets

METHOD AND APPARATUS FOR CONTENT ADDRESSABLE MEMORY WITH A PARTITIONED MATCH LINE

FIELD OF THE INVENTION

The present invention relates to content addressable memory (CAM) circuitry with a partitioned match line.

BACKGROUND OF THE INVENTION

When one needs to do a fast search among large amounts of data one usually uses associative memories or content addressable memories (CAM). By using a fully parallel CAM, i.e., all cells in all rows of the CAM are searched simultaneously, one can search through the whole memory with only one instruction and this is very fast.

A drawback with a common parallel CAM is the large power consumption. The most common way to implement the match operation in a fully parallel CAM is to use a wired-OR gate for the match operation. This wired-OR gate is implemented with a wire, a match line, which is common to all CAM cells in a row. All cells can discharge the normally precharged line if there is a mismatch, or leave it alone if there is a match, for the searched and the stored bit of each CAM cell. The match line has a high capacitance due to the many CAM cells. The precharge and the very common discharges make the activity of the line almost equal to one under normal usage of the CAM. Hence, the power consumption of the match line is high.

Another known way to implement a CAM is to do it serially. In a serial implementation, a CAM row is searched bit by bit. However, the serial implementations have high latency.

It is also previously known to divide a CAM into parts. U.S. Pat. No. 5,517,441 to Dietz, et al. discloses CAM circuitry in which logic states of a first and second part of a match line are selectively modified in response to comparisons between information, and the logic state of a second match line is selectively modified in response to the logic state of the first match line. This design results in faster comparisons when the search data input is partitioned.

U.S. Pat. No. 5,592,407 to Konishi, et al. discloses an associative memory divided into blocks. The power consumption is reduced by making active only the necessary areas. The prior art does not effectively address the issue of high power consumption in a CAM circuit.

SUMMARY OF THE INVENTION

In a content addressable memory comprising at least one row of memory cells, each memory cell in said row for storing data and including a comparator for comparing the data in said memory cell with search data selectively coupled to the memory cell and a match line connected to the memory cell to indicate whether the search data matched the data stored in the memory cell. In one embodiment, the present invention is a row compare circuit for generating a result output that indicates when the data in each memory cell in said row matches the search data coupled thereto, comprising a plurality of comparison control units for partitioning the memory cells in said row into at least two segments of memory cells, each said comparison control unit for controlling the comparing of the data in the memory cells grouped in its associated segment of memory cells with search data coupled to the memory cells in said segment, each said memory cell in a given segment connected in common to a match line, said match line being caused to indicate whether the search data does not match the data stored in any of the memory cells in that segment, each said comparison control unit except the first comparison control unit operative to determine the result of a previous segment's compare operation, each said comparison control unit being prevented from executing a compare operation with respect to its segment of memory cells when a mismatch has been detected by a previous segment's compare operation in said row, and wherein the first comparison control unit in said row presents the match line connected to the memory cells in the first segment of memory cells to cause the memory cells in said first segment to be compared with search data coupled to the memory cells in said segment whenever a row comparison operation is initiated, said first segment match line being caused to indicate whether the search data does not match the data stored in any of the memory cells in said first segment, said subsequent match lines in said row being present only if combined result of the segment compare operations of the respective preceding segments is a match; and a match determination unit is coupled to the match line of the last segment of memory cells in said row for generating said result output, which may be preset by being precharged.

In another embodiment, each said comparsion control unit has a clock input coupled to a clock signal line from a single clock for triggering its compare operation to begin, wherein the compare operation of said first comparison control unit is triggered by a clock signal without a delay from said clock, and the compare operation of each subsequent comparison control unit is triggered by a clock signal from said clock having a delay.

In another embodiment of the present invention, the row compare circuit further comprises a forward line coupled to each said comparison control unit for transmitting a mismatch signal from one segment to a next segment for preventing the comparison control unit in said next segment from executing a compare operation with respect to its segment of memory cells, said forward line further coupled to said match determination unit for transmitting said mismatch signal to said match determination unit.

In yet another embodiment of the present invention, the content addressable memory row compare circuit further comprises a plurality of group comparison control units, each said group comparison control unit coupled to each segment match line in a column of segments in said group of rows for detecting a mismatch result from any segment match line in said column; a group match determination unit for gating each said match determination unit in said group of rows; and a forward line coupled to each said group comparison control unit for transmitting a mismatch signal from one column of segments to a next column of segments for preventing all comparison control units in said next column of segments from executing a compare operation with respect to its segment of memory cells, said forward line further coupled to said group match determination unit for transmitting said mismatch signal to said group match determination unit.

In still another embodiment of the present invention, the content addressable memory match determination unit is further operative such that if a series of search data to be compared is stored in a plurality of rows such that a row-compare operation for at least two rows is required, the row compare operation of a first row is always executed, and the row compare operation of each subsequent row is executed only if the match determination for the preceding row indicates a match.

The object of the present invention is to provide a novel implementation of a content addressable memory circuit having reduced power consumption. This is achieved by partitioning the match wire and designing the CAM such that the precharge and/or evaluation of the segments of the match line are made conditional. A key advantage of the present invention is that the power consumption of the device from precharging and discharging the match line is reduced since only a part of the comparison circuitry will be activated during most searches. Another advantage is that the present invention provides for a faster operating memory device.

BRIEF DESCRIPTION OF THE DRAWINGS

The invention will be described further in detail below with reference to the accompanying in which.

DETAILED DESCRIPTION OF THE INVENTION

Figure 1:
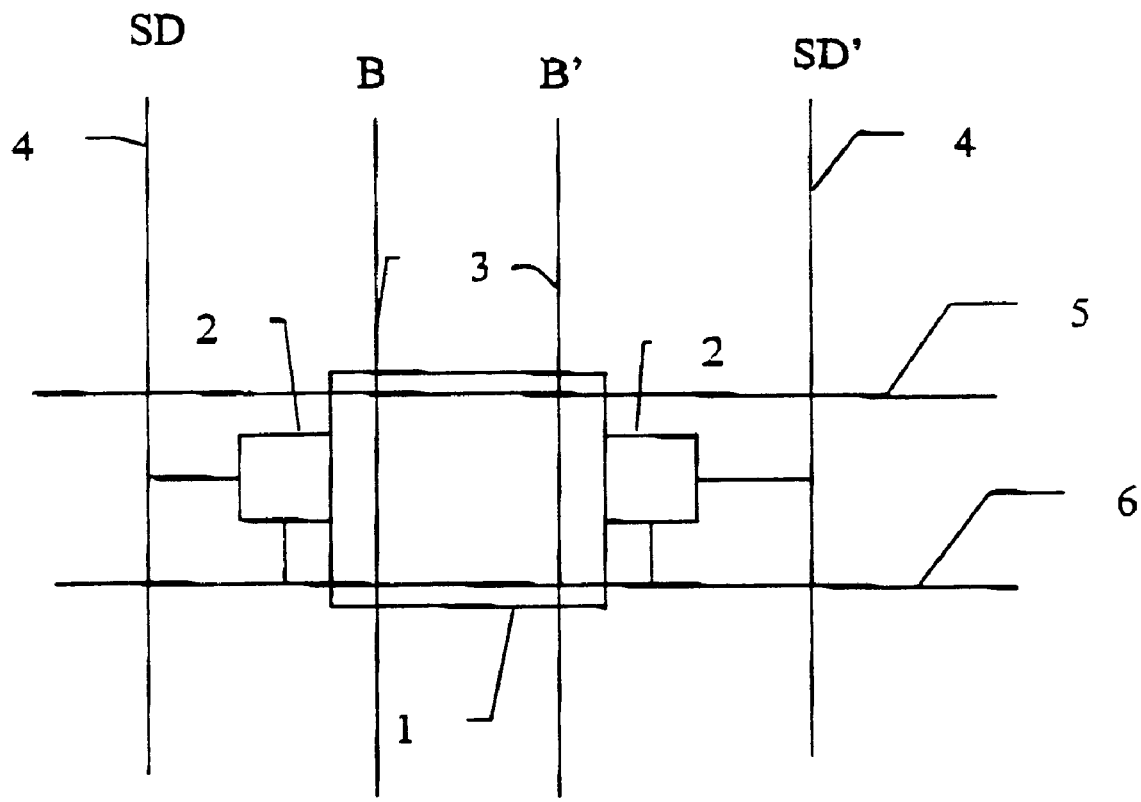
FIG. 1 diagram of a typical CAM cell.

A typical CAM cell that may be incorporated in the present invention is illustrated in FIG. 1. It should be noted that the design of the CAM cell does not form a part of the. present invention and other suitable CAM cells are well known in the art. The basic cell 1 stores data B, B', that may be read and written as a random access memory (RAM) cell by means of a word line 5 for selecting the cell and a complimentary pair of bit lines 3 for storing or retrieving data. The RAM functionality is well known in the prior art. For the compare operation in the CAM functionality, the cell is connected via comparators 2 to a complementary pair of search or match data lines 4. The comparison operation is normally implemented with a wired-OR gate that usually utilizes two phases for each operation, a precharge phase and an evaluation phase. The wired-OR gate has a wire that is shared by all memory cells. It is usually called the match wire or line. In a compare or match operation, the match line 6 is precharged and then a complementary pair of search data SD, SD' is applied on the search data lines 4. The evaluation phase of the search operation is when the comparators of the cells have the possibility to discharge the match line. If the search data matches the stored data, the match line 6 state will be unchanged by the cells 1. If there is a mismatch, any cell,.with a mismatch, will discharge the match line 6. The result of the evaluation is determined by checking the status of the match line. Both the precharge and discharge of the match line contribute to the power consumption of the memory.

According to the invention, a compare operation will, in most cases, not be executed if either of the precharge or the evaluation is not performed.

When the prior segment, to an intermediate segment, indicates a mismatch, this information must be provided to segments following the intermediate segment, for example, by forcing the intermediate segment match wire to indicate a mismatch or by the use of a separate wire, a forward wire, that indicates a mismatch and therefore overrides the match wire state.

Figure 2:
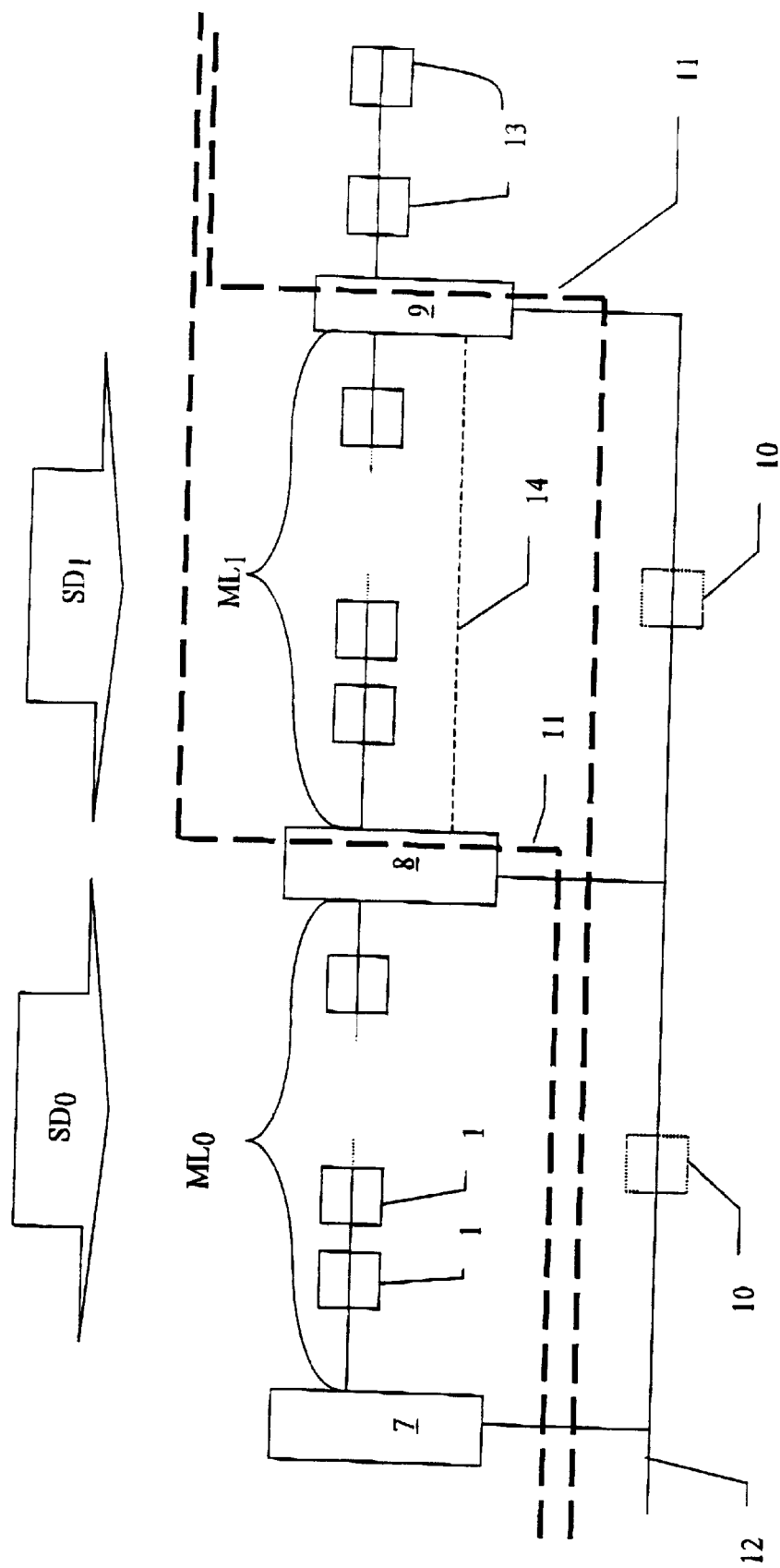
FIG. 2 is schematic illustration of one row of a CAM circuit according to the preferred embodiment of the present invention.

In FIG. 2, one row of a CAM circuit according to the invention is illustrated. Generally, the CAM memory comprises several rows having common bit lines and search data lines. However, all rows are identical and only one is illustrated in FIG. 2. Each row comprises typically 64 identical CAM cells 1, of which only a number is shown. The match line 6 interconnects the CAM cells, but according to the present invention the match line is partitioned into a number of the segments. In FIG. 2 two segments $ML_0$ and $ML_1$ are shown.

A row compare operation refers to the comparison operation of the whole row, while a segment operation refers to the comparison operation of one segment only. An entry may be stored in several rows. Therefore, an entry-comparison operation may require several row-comparison operations.

The first segment $ML_0$ is precharged by a comparison-control unit 7 serving to precharge the match line, to control the application of search data and therefore the evaluation of the search operation. The second segment $ML_1$ is precharged by a match-determination and comparison-control unit 8 serving to precharge the match line, to control the application of search data and therefore the evaluation of the search operation of the second segment, and also to read the result of the comparison operation of the preceding first segment, that is to determine if there is a match. The match determination of the preceding segment may control if the comparison of the subsequent segment is to be performed or not. After the last segment a match-determination unit 9 takes care of reading the result of the comparison operation of the last segment of the match line, here $ML_1$. The match-determination unit 9 provides the result output. Also the search data is partitioned into two parts, $SD_0$ and $SD_1$, as illustrated by the two block arrows.

In a compare operation, all cells 1 in a segment are subjected to a relevant part of the search data. All cells with a mismatch contribute to the discharging of the match-line segment. One cell is sufficient to discharge the match-line segment, but the more cells that are contributing to the discharge, the faster the match-line segment will be discharged. As will be explained below, the timing is adjusted to the maximum expected discharge time. If all cells match, the match line will remain high. The match line is received as an input to the match-determination and comparison-control unit 8 of the next segment or the final match-determination unit 9, as the case may be. If the last match-line segment remains high, this indicates a complete match and this result is output by the result or match-determination unit 9.

Thus, the condition that the combined result of all the preceding segments is match, in other words no preceding segment has a mismatch, is used either to indicate a complete match or as an input enabling further compare operations;

Data associated to the row may be stored in extra RAM cells 13, which are read by means of the word line and bit lines shown- in FIG. 1. Also some of the CAM cells may be configured to store associated data by the use of masks, if they are not involved in the compare operation. In some associative memories each row is associated with a fixed address pointing to a result stored in another memory table. Usually the CAM memory contains several rows. In case of matches in several rows, a priority function (not shown) located after the match-determination units ensures that only one row is selected as the match with the highest priority.

Also masks may be applied to the search data between rows (not shown) and/or the stored data in order to achieve certain functionality. However, this does not form part of the present invention.

As mentioned in the introduction, the power consumption is reduced if the rows are partitioned. That is because, if there is a mismatch in the first segment, the comparison operations in subsequent segments need not be performed. Generally, only the first segment is toggling between charged and discharged states under normal usage. The possibly hierarchical structure of data stored in the memory rows may contribute to this behavior even more than if the data were randomly distributed.

In a first and preferred embodiment of the invention, the memory circuit is designed with a conditional precharge of match-line segments. In FIG. 2, two segments are shown but further divisions are possible.

For each segment, the events have to occur in a fixed order. If the segment is to be subjected to a compare operation, the segment is first precharged, then the search data is applied through the search data lines, then a time has to pass allowing the match line to be discharged, thereafter the state of the match line can be used by succeeding blocks. In the first embodiment, the first segment $ML_0$ is always precharged. Then the search data $SD_0$ is applied. After a predefined time duration, the state of the match-line segment $ML_0$ can be used by succeeding blocks. If the match-line segment $ML_0$ has been discharged, i.e. at least one bit mismatch has occurred, the subsequent match-line segment $ML_1$ is not precharged by the match-determination and comparison-control unit 8 but is set to low. The same applies to any subsequent match-line segment.

If there is no mismatch in the first segment $ML_0$, the match line will remain high. A logic circuit in the match-determination and comparison-control unit 8 combines the state of the match-line segment $ML_0$ with the clock input so that the unit 8 precharges the match-line segment $ML_1$ only if the preceding match-line segment is high, i.e. a positive match determination. If all cells match the search data, all the match-line segments will remain high and the result unit.9 will output the result of the match operation as before.

The advantage of the first embodiment is that there will be a precharge only if there is a match in the preceding segment and the activity of the match wire will decrease.

In a second embodiment of the present invention the memory circuit is designed with a conditional evaluation of match-line segments. This embodiment uses an additional signal transmitted on a forward line 14 shown in broken lines. Initially, all match-line segments are precharged. The first part of the search data $SD_0$ is applied to the first row segment. If all cells 1 match, the next part of the search data. $SD_1$ is applied to the next segment. However, if there is at least one bit mismatch in the first segment, this will be detected by the match-determination and comparison-control unit 8, therefore the second segment will not be evaluated and a mismatch message will be transmitted through the separate forward line 14 to the next match-determination and comparison-control unit or, in case of the last match-line segment, to the match-determination unit 9. The mismatch message will override the state of the ordinary match line to ensure that the result of the match determination is a miss. Subsequent segments of the row will not be evaluated. The evaluation may be stopped in various ways, either by stopping the search data or by means of a control signal. The forward line has lower capacitance and activity than the match wire of a fully parallel CAM making the added power from the forward line significantly less than the power saved by the lower activity on the match wires.

The advantage of the second embodiment is that there will be no discharge of subsequent segments if there is a mismatch in the preceding segment, and the precharge in the next compare operation is reduced to segments discharged previously.

In a third embodiment of the present invention the memory circuit is designed with a combined conditional precharge and evaluation of match-line segments. The first segment $ML_0$ is always precharged and evaluated as in the first embodiment. If the match-line segment $ML_0$ has been discharged, i.e. at least one bit mismatch has occurred, the subsequent match-line segment $ML_1$ is not precharged by the match-determination and comparison-control unit 8. However, a mismatch message will be transmitted through a separate forward line 14 to the next match-determination and comparison-control unit or, in case of the last match-line segment, to the match-determination unit 9 as in the second embodiment. Subsequent segments of the match line $ML_1$ will not be precharged nor evaluated but remain in its previous state, whether high or low. If there is no mismatch in the first segment $ML_0$, the match line will remain high. A logic circuit in the match-determination and comparison-control unit 8 combines the state of the match-line segment $ML_0$ with the clock input so that the unit 8 precharges the match-line segment $ML_1$ only if the preceding match-line segment is high. If all cells match the search data all the match-line segments will remain high and the result unit 9 will output the result as before.

The advantage of the third embodiment is that there will be a precharge and evaluation only if there is a match in the preceding segment, and there is a discharge of the segment only if there is a mismatch in the evaluation.

Figure 3:
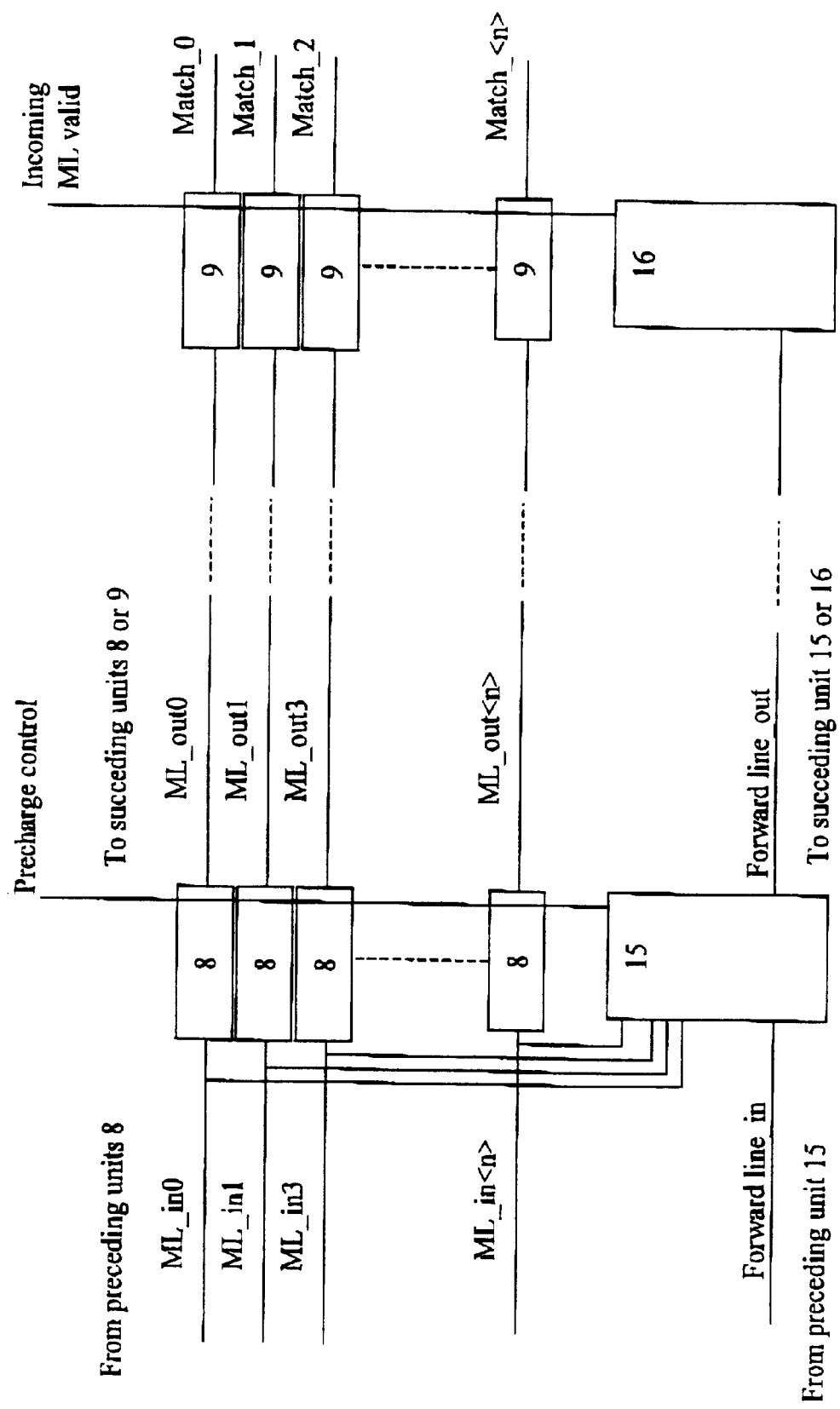
FIG. 3 is schematic illustration of a group of rows of a CAM circuit according to another embodiment of the present invention.

One approach to reduce or eliminate the power consumed in connection with applying the search data is not to perform the evaluation by, e.g., not applying the search data. For example, a forward line that is shared by a number of rows, e.g. 16 rows, is used to both control the application of search data and to provide the following segment with the information that there is no match in the 16 rows. This is an implementation of a fourth embodiment of the invention and is shown in FIG. 3. The match lines, ML__in0 to ML__in<n>, are fed to a common group match-determination and comparison-control unit 15 that determines if there is any match in the group and outputs the result on the shared forward line to a common group match-determination unit 16 (or a further interposed group match-determination and comparison-control unit 15). The group match-determination units 9 outputs are gated by the common group match-determination unit 16. Their outputs are forced to indicate mismatch when the state of the incoming match lines to the match-determination units 9 is not valid. If there is no match in the first segment in any one of the 16 rows, a group mismatch message will be transmitted through the common group forward line and eventually to the final group match-determination unit 16.

The fourth embodiment may be designed with conditional precharge and/or conditional evaluation. In other words, the first segments are always precharged and there is a conditional precharge and/or evaluation of subsequent segments in a manner similar to the first and third embodiments; or all segments are always precharged and there is a conditional evaluation of subsequent ₁segments in a manner similar to the second embodiment. The case with row-based conditional precharge and group-based conditional evaluation is a combination of the first embodiment on the row level and the second embodiment on the level of a group of 16 rows resulting in a variation on the third embodiment.

As mention above, one entry may be stored in several rows. Then, an entry-comparison operation requires several row-comparison operations. The first row-comparison operation is always executed, while the execution of subsequent row-comparison operations for an entry are dependent on the result of the entry's preceding row-comparison operations.

Due to the partitioning there is a need for more timing control signals (clock signals). One way is to use self-timing to provide the needed control signals. Since more operations may be performed in the same clock cycle, the self-timing do not increase the latency of the chip. Another way to provide the clock signals is to pipeline the match operation. However, this increases the latency of the chip since one compare operation is performed over several clock cycles. High throughput and low power are in many cases more important than low latency.

If self-timing is used, one clock cycle is divided by introducing delays in the clock signal line 12. As may be seen from FIG. 2, the first comparison-control unit 7 is triggered by the clock without any delay.

Precharge is done as a preparation before the clock edge starts the evaluation of the first segment. The delay 10 is set such that there is sufficient time to discharge the match-line segment even if only one mismatching cell performs the discharge. A delay inside the match-determination and comparison-control unit 8, that is not shown in FIG. 2, gives the unit 8 sufficient time to precharge its. match-line segment. More delays 10 are introduced in the clock signal line 12 between: the match-determination and comparison-control unit 8 and subsequent units and the final match determination unit 9.

If pipelining is used, the same clock controls all the units 7, 8 and 9, i.e. without the delays 10 shown in phantom lines. Thus, when the clock is in its precharge phase the match line MLO is precharged and the following match lines are conditionally precharged, and when the clock is in the evaluation phase, the evaluation starts of the comparison operation of the segments, that may be conditional for all segments except the first. Flip-flops are inserted between the row segments to store the segments comparison operation result. The search data word must be clocked through flip-flops to match the scheduling of the comparison operations of each segment. In FIG. 2 the introduced layers of flip-flops are represented with thick dashed lines 11 to emphasize the partitioning of the circuit into slices when introducing pipelining. Time-discrete signals passing the slice interfaces will go through a flip-flop (if we assume no signals going in the backwards direction). Time-analog signals, e.g. a clock, passing the layer are not fed through flip-flops. Due to the pipelining, the applied search data $SD_0$ for the first segment belongs to one word while the simultaneously applied search data $SD_1$ for the next segment belongs to the preceding search data word.

Combinations of self-timing and pipelining can also be used to provide the needed timing control to perform the partitioned compare operations.

Preferred embodiments of the invention have been described in detail above. However, as will be appreciated by a person skilled in the art, various changes, substitutions and modifications can be made in the exemplary embodiments without departing from the scope of the present invention. The scope of the invention is not limited by the disclosed embodiments but is defined by the following claims.

What is claimed is:

1. In a content addressable memory comprising at least one row of memory cells, each memory cell in said row for storing data and including a comparator for comparing the data in said memory cell with search data selectively coupled to the memory cell and a match line connected to the memory cell to indicate whether the search data matched the data stored-in the memory cell, a row compare circuit for generating a result output that indicates when the data in each memory cell in said row matches the search data coupled thereto, comprising:

a plurality of comparison control units for partitioning the memory cells in said row into at least two segments of memory cells, each said comparison control unit for controlling the comparing of the data in the memory cells grouped in its associated segment of memory cells with search data coupled to the memory cells in said segment, each said memory cell in a given segment connected in common to a match line, said match line being caused to indicate whether the search data does not match the data stored in any of the memory cells in that segment, each said comparison control unit except the first comparison control unit operative to determine the result of a previous segment's compare operation, each said comparison control unit being prevented from executing a compare operation with respect to its segment of memory cells when a mismatch has been detected by a previous segment's compare operation in said row, and wherein the first comparison control unit in said row presets the match line connected to the memory cells in the first segment of memory cells to cause the memory cells in said first segment to be compared with search data coupled to the memory cells in said segment whenever a row comparison operation is initiated, said first segment match line being caused to indicate whether the search data does not match the data stored in any of the memory cells in said first segment, said subsequent match lines in said row being preset only if the combined result of the segment compare operations of the respective preceding segments is a match; and a match determination unit coupled to the match line of the last segment of memory cells in said row for generating said result output.

2. A memory circuit according to claim 1, wherein said match line is preset by being precharged.

3. A memory circuit according to claim 1, each said comparsion control unit having a clock input coupled to a clock signal line from a single clock for triggering its compare operation to begin, wherein the compare operation of said first comparsion control unit is triggered by a clock signal without a delay from said clock, and the compare operation of each subsequent comparsion control unit is triggered by a clock signal from said clock having a delay.

4. In a content addressable memory comprising at least one row of memory cells, each memory cell in said row for storing data and including a comparator for comparing the data in said memory cell with search data selectively coupled to the memory cell and a match line connected to the memory cell to indicate whether the search data matched the data stored in the memory cell, a row compare circuit for generating a result output that indicates when the data in each memory cell in said row matches the search data coupled thereto, comprising:

a plurality of comparison control units for partitioning the memory cells in said row into at least two segments of memory cells, each said comparison control unit for controlling the comparing of the data in the memory cells grouped in its associated segment of memory cells with search data coupled to the memory cells in said segment, each said memory cell in a given segment connected in common to a match line, said match line being caused to indicate whether the search data does not match the data stored in any of the memory cells in that segment, each said comparison control unit except the first comparison control unit operative to determine the result of a previous segment's compare operation, each said comparison control unit being prevented from executing a compare operation with respect to its segment of memory cells when a mismatch has been detected by a previous segment's compare operation in said row, and wherein the first comparison control unit in said row presets the match line connected to the memory cells in the first segment of memory cells to cause the memory cells in said first segment to be compared with search data coupled to the memory cells in said segment whenever a row comparison operation is initiated, said first segment match line being caused to indicate whether the search data does not match the data stored in any of the memory cells in said first segment;

a match determination unit coupled to the match line of the last segment of memory cells in said row for generating said result output; and a forward line coupled to each said comparison control unit for transmitting a mismatch signal from one segment to a next segment for preventing the comparison control unit in said next segment from executing a compare operation with respect to its segment of memory cells, said forward line further coupled to said match determination unit for transmitting said mismatch signal to said match determination unit.

5. A memory circuit according to claim 4, wherein said subsequent match lines in said row are also preset when said first segment match line is preset.

6. A memory circuit according to claim 4, wherein said subsequent match lines in said row are preset only if the combined result of the segment compare operations of the respective preceeding segments is a match.

7. A memory circuit according to claim 4, each said comparison control unit having a clock input coupled to a clock signal line from a single clock for triggering its compare operation to begin, wherein the compare operation of said first comparison control unit is triggered by a clock signal without a delay from said clock, and the compare operation of each subsequent comparison control unit is triggered by a clock signal from said clock having a delay.

8. In a content addressable memory comprising at least one group of rows of memory cells, each memory cell in each said row for storing data and including a comparator for comparing the data in said memory cell with search data selectively coupled to the memory cell and a match line connected to the memory cell to indicate whether the search data matched the data stored in the memory cell, a row compare circuit for generating a result output that indicates when the data in each memory cell in each said row matches the search data coupled thereto, comprising:

a plurality of comparison control units for partitioning the memory cells in each said row into at least two segments of memory cells, said group being partitioned into at least two columns of segments each said comparison control unit for controlling the comparing of the data in the memory cells grouped in its associated segment of memory cells with search data coupled to the memory cells in said segment, each said memory cell in a given segment connected in common to a match line, said match line being caused to indicate whether the search data does not match the data stored in any of the memory cells in that segment, each said comparison control unit except the first comparison control unit operative to determine the result of a previous segment's compare operation, each said comparison control unit being prevented from executing a compare operation with respect to its segment of memory cells when a mismatch has been detected by a previous segment's compare operation in said row, and wherein the first comparison control unit in said row presets the match line connected to the memory cells in the first segment of memory cells to cause the memory cells in said first segment to be compared with search data coupled to the memory cells in said segment whenever a row comparison operation is initiated, said first segment match line being caused to indicate whether the search data does not match the data stored in any of the memory cells in said first segment;

a match determination unit coupled to the match line of the last segment of memory cells in each said row for generating said result output;

a plurality of group comparison control units, each said group comparison control unit coupled to each segment match line in a column of segments in said group of rows for detecting a mismatch result from any segment match line in said column;

a group match determination unit for gating each said match determination unit in said group of rows; and a forward line coupled to each said group comparison control unit for transmitting a mismatch signal from one column of segments to a next column of segments for preventing all comparison control units in said next column of segments from executing a compare operation with respect to its segment of memory cells, said forward line further coupled to said group match determination unit for transmitting said mismatch signal to said group match determination unit.

9. A memory circuit according to claim 8, wherein said subsequent match lines in each said row are also preset when said first segment match line is present.

10. A memory circuit according to claim 8, wherein said subsequent match lines in each said row are preset only if the combined result of the segment compare operations of the respective preceeding segments is a match.

11. In a content addressable memory comprising a plurality of rows of memory cells, each memory cell in each said row for storing data and including a comparator for comparing the data in said memory cell with search data selectively coupled to the memory cell and a match line connected to the memory cell to indicate whether the search data matched the data stored in the memory cell, a row compare circuit for generating a result output that indicates when the data in each memory cell in each said row matches the search data coupled thereto, comprising:

a plurality of comparison control units for partitioning the memory cells in each said row into at least two segments of memory cells, each said comparison control unit for controlling the comparing of the data in the memory cells grouped in its associated segment of memory cells with search data coupled to the memory cells in said segment, each said memory cell in a given segment connected in common to a match line, said match line being caused to indicate whether the search data does not match the data stored in any of the memory cells in that segment, each said comparison control unit except the first comparison control unit operative to determine the result of a previous segment's compare operation, each said comparison control unit being prevented from executing a compare operation with respect to its segment of memory cells when a mismatch has been detected by a previous segment's compare operation in said row, and wherein the first comparison control unit in each said row presets the match line connected to the memory cells in the first segment of memory cells to cause the memory cells in said first segment to be compared with search data coupled to the memory cells in said segment whenever a row comparison operation is initiated, said first segment match line being caused to indicate whether the search data does not match the data stored in any of the memory cells in said first segment, said subsequent match lines in said row being preset only if the combined result of the segment compare operations of the respective preceding segments is a match; and a match determination unit coupled to the match line of the last segment of memory cells in each said row for generating said result output, wherein if a series of search data to be compared is stored in a plurality of rows such that a row-compare operation for at least two rows is required, the row compare operation of a first row is always executed, and the row compare operation of each subsequent row is executed only if the match determination for the preceding row indicates a match.

12. A memory circuit according to claim 11, wherein said subsequent match lines in said row are also preset when said first segment match,line is present.

13. A memory circuit according to claim 11, wherein said subsequent match lines in said row are preset only if the combined result of the segment compare operations of the respective preceding segments is a match.

* * * * *